United States Patent
Yanagisawa et al.

(10) Patent No.: US 12,407,959 B2
(45) Date of Patent: Sep. 2, 2025

(54) ADAPTIVE DATA SELECTION FOR DCG / DAG

(71) Applicant: OMNIVISION TECHNOLOGIES, INC., Santa Clara, CA (US)

(72) Inventors: Nobuhiro Yanagisawa, San Jose, CA (US); Hiroaki Ebihara, San Jose, CA (US); Hiroki Ui, Yokohama (JP); Naoki Kitazawa, Yokohama (JP); Ryuichi Moriizumi, Kanagawa (JP)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 97 days.

(21) Appl. No.: 18/394,861

(22) Filed: Dec. 22, 2023

(65) Prior Publication Data
US 2025/0211878 A1 Jun. 26, 2025

(51) Int. Cl.
H04N 25/772 (2023.01)
H03M 1/18 (2006.01)

(52) U.S. Cl.
CPC .......... *H04N 25/772* (2023.01); *H03M 1/186* (2013.01)

(58) Field of Classification Search
None
See application file for complete search history.

(56) References Cited

U.S. PATENT DOCUMENTS 9,203,421 B2 * 12/2015 Takaike ................ H03M 1/181

* cited by examiner

*Primary Examiner* — Mark T Monk
(74) *Attorney, Agent, or Firm* — CHRISTENSEN O'CONNOR JOHNSON KINDNESS PLLC

(57) ABSTRACT

A pixel circuit, including a pixel array comprising a plurality of pixels, a plurality of analog to digital converters (ADCs), where during a pixel data readout the plurality of ADCs is communicatively coupled to a respective pixel of the plurality of pixels to receive image data from the respective pixel of the plurality of pixels, a plurality of judge blocks, wherein each judge block is communicatively coupled to a respective ADC of the plurality of ADCs and wherein each judge block is configured to select and transmit gain data based on comparing an output of the respective ADC to a predetermined threshold for the respective ADC, and an image signal processor (ISP) configured to receive outputs from the plurality of ADCs, and combine the outputs of the plurality of ADCs to produce a combined converted value for the respective pixel.

20 Claims, 12 Drawing Sheets

10bit ADC with 1 extra bit + sign bit

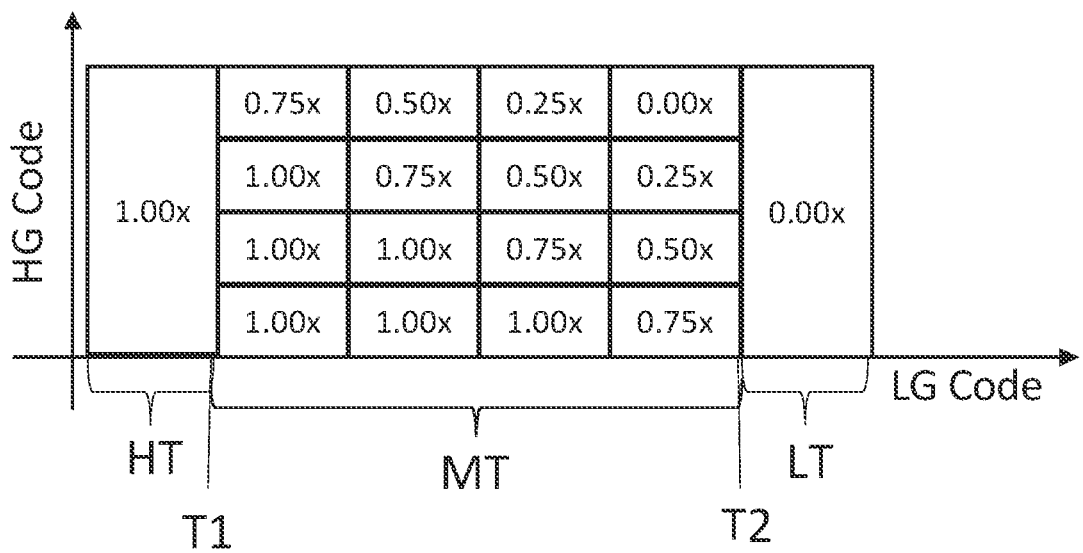
FIG. 8A
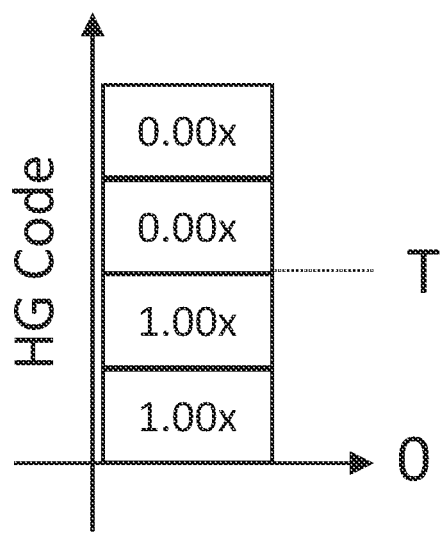  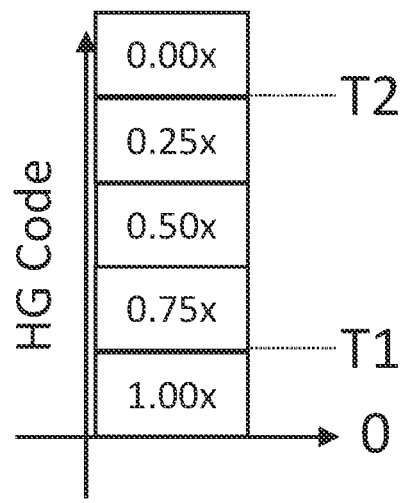
FIG. 8B              FIG. 8C

ADAPTIVE DATA SELECTION FOR DCG / DAG

BACKGROUND INFORMATION

Field of the Disclosure

This disclosure relates generally to the design of image sensors, and in particular, relates to image sensors having improved illumination of photodiodes.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

Image sensor operates in response to image light coming from an external scene and being incident upon the image sensor. An image sensor includes an array of pixels having photosensitive elements (e.g., photodiodes) that absorb a portion of the incident image light and in response generate corresponding electrical charge. The electrical charge of individual pixels may be measured as an output voltage of each photosensitive element. In general, the output voltage varies as a function of the intensity and duration of the incident light. The output voltage of individual photosensitive elements is used to produce a digital image (i.e., image data) representing an external scene.

In some applications, photodiodes are illuminated by the incoming light through a combination of lens and color filter, thus exposing individual photodiodes to a given color (wavelength) of light, for example, blue, green, or red. Based on the photodiodes being exposed to only limited wavelength range, the properties of the photodiodes can be optimized, such that, for example, a peak sensitivity of given photodiode is within the target range of light wavelengths. However, the lenses and color filters necessarily attenuate the incoming light, therefore limiting dynamic range of the photodiodes. Therefore, systems and methods are needed for improved illumination and dynamic range of the image sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 8A is a graph of a first threshold and a second threshold for determining a selected conversion gain, in accordance with an embodiment of the present disclosure.

FIG. 8B is a graph of a predetermined threshold for determining a selected conversion gain, in accordance with an embodiment of the present disclosure.

FIG. 8C is a graph of a predetermined threshold T for determining a selected conversion gain, in accordance with an embodiment of the present disclosure.

Figure 1:
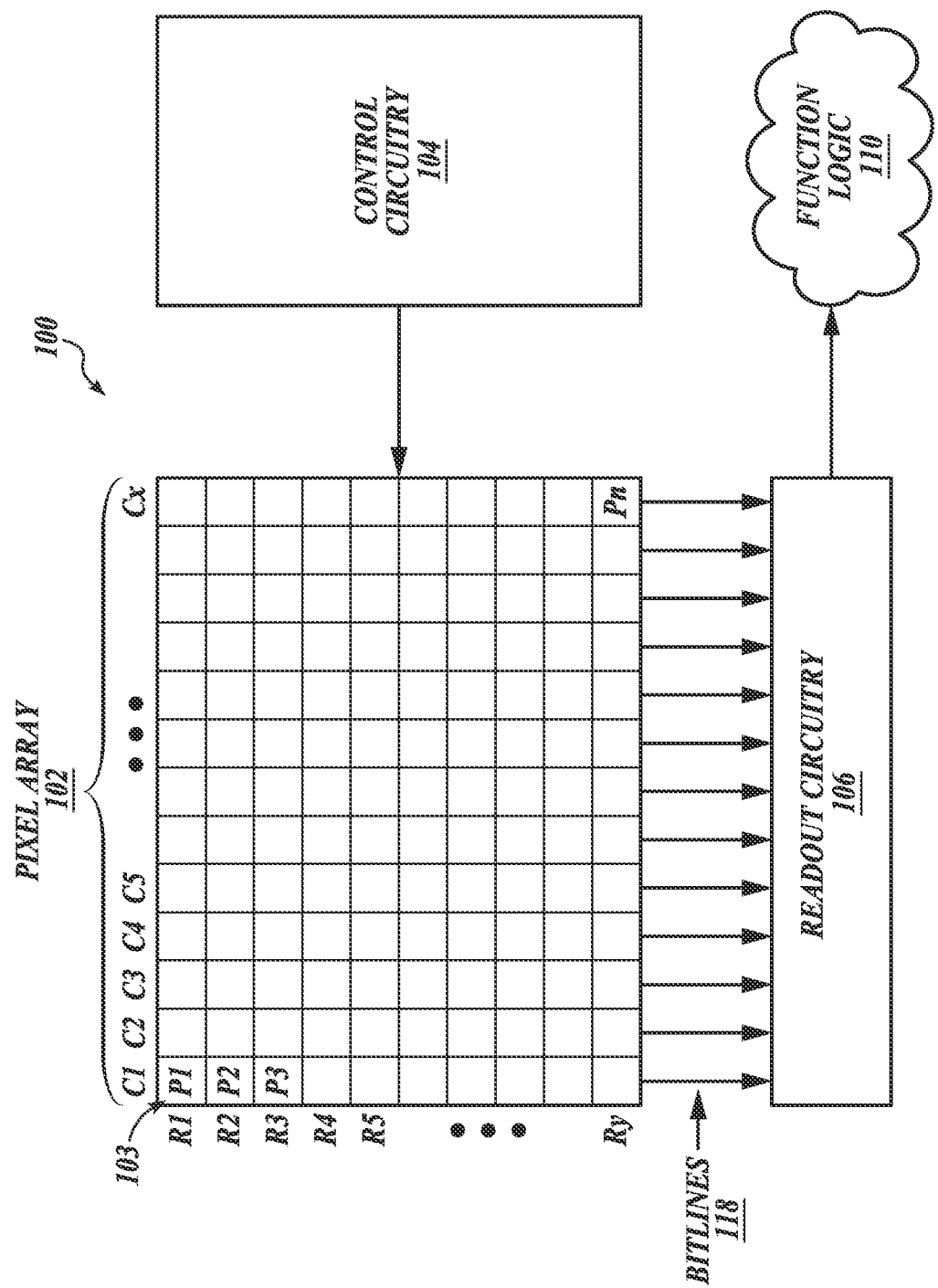
FIG. 1 illustrates an imaging system according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors that include color routers are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the terms "about," "approximately," etc., mean+/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to image sensors for use under a variety of lighting levels. In some embodiments, the image sensor, via a plurality of analog to digital converters (ADCs) transmits both low gain data and high gain data. In some embodiments, a judge block selects either the low gain data or the high gain data based on a predetermined threshold. In some embodiments, the predetermined threshold is a saturation condition of a most significant bit (MSB). In some embodiments, the predetermined threshold is a voltage reading at a judge timing pulse, issued at a predetermined time. In some embodiments, the predetermined threshold is based on a high gain code. In some embodiments, the predetermined threshold includes a first threshold and a second threshold. In some embodiments, when an output of an ADC of the plurality of ADCs is below the first threshold, high gain is transmitted, and when the output of the ADC is above the second threshold, low gain is transmitted. When the output of an ADC of the plurality of ADCs is between the first threshold and the second threshold, a mixture of the high gain data and the low gain data is transmitted.

FIG. 1 illustrates an example imaging system 100 in accordance with an embodiment of the present disclosure. The imaging system 100 includes a pixel array 102, a control circuitry 104, a readout circuitry 106 (also referred to as a pixel circuitry) and a function logic 110. In one example, the pixel array 102 is a two-dimensional (2D) array of photodiodes or image sensor pixels 112 (e.g., pixels P1, P2 . . . , Pn). As illustrated, the photodiodes are arranged into rows (e.g., rows R1 to Ry) and columns (e.g., column C1 to Cx). In operation, the photodiodes acquire image data of an outside scene, which can then be used to render a 2D image of the person, place, object, etc. However, in other embodiments the photodiodes may be arranged into configurations other than rows and columns.

In an embodiment, after each pixel 112 in the pixel array 102 acquires its image charge, the image data is read out by the readout circuitry 106 via bitlines 118, and then transferred to a function logic 110. In various embodiments, the readout circuitry 106 may include signal amplifiers, analog-to-digital (ADC) conversion circuitry and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 112 and the readout of image data from the readout circuitry 106. The function logic 110 may be a digital processor, for example. In one embodiment, the readout circuitry 106 may read one row of image data at a time along readout column lines (bitlines 118) or may read the image data using a variety of other techniques, such as a serial readout or a full parallel readout of all pixels simultaneously (not illustrated).

In one embodiment, the control circuitry 104 is coupled to the pixel array 102 to control operation of the plurality of photodiodes in the pixel array 102. For example, the control circuitry 104 may generate a shutter signal for controlling image acquisition. In one embodiment, the shutter signal is a global shutter signal for simultaneously enabling all pixels within the pixel array 102 to simultaneously capture their respective image data during a single data acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash.

In one embodiment, readout circuitry 106 includes analog-to-digital converters (ADCs), which convert analog image data received from the pixel array 102 into a digital representation. The digital representation of the image data may be provided to the function logic 110. In some embodiments, the data transmission circuitry 108 may receive the digital representations of the image data from the ADCs in parallel and may provide the image data to the function logic 110 in series.

In different embodiments, imaging system 100 may be included into a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/ flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
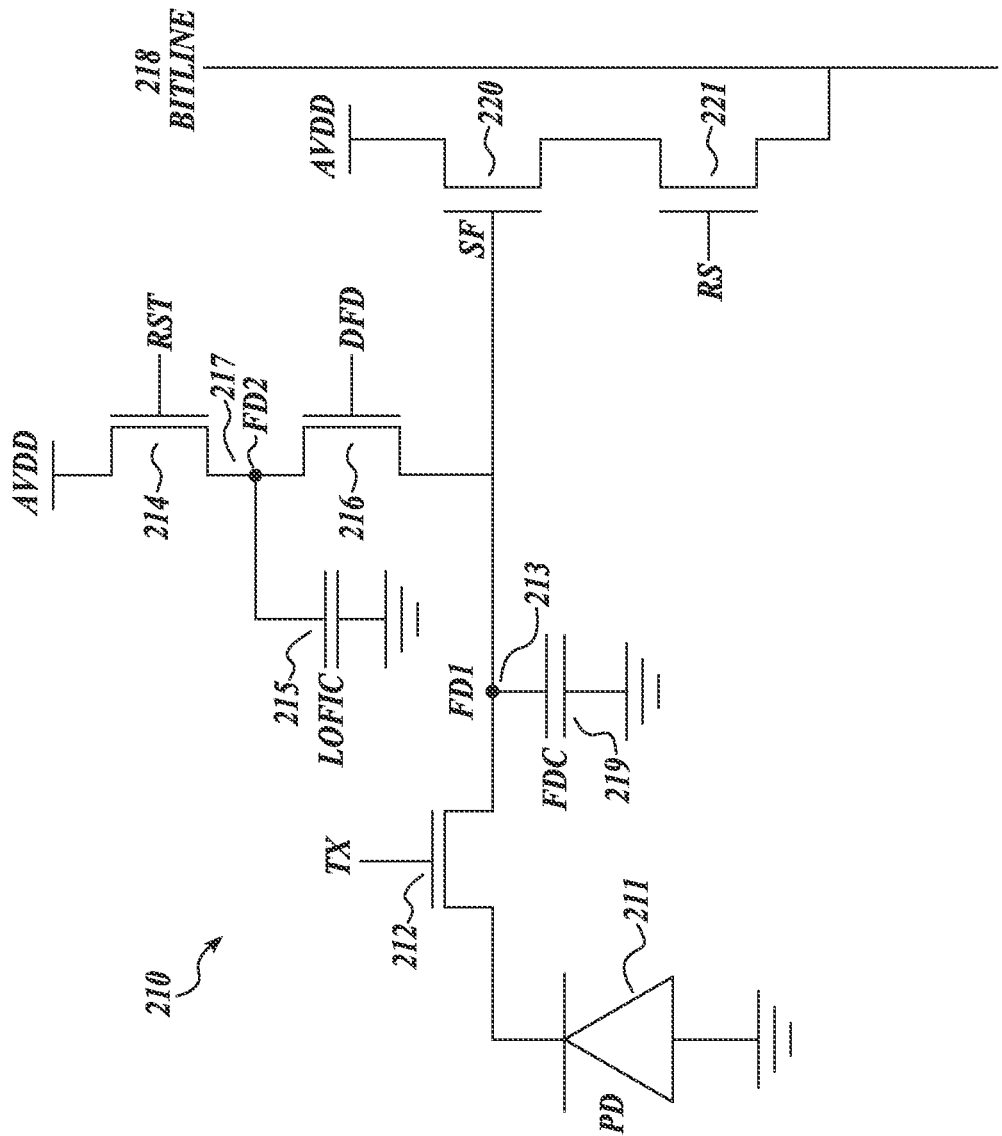
FIG. 2 is an illustrative schematic of a conventional pixel circuit in accordance with the present disclosure.

FIG. 2 is an illustrative schematic of a conventional pixel 210 in accordance with the present disclosure. The pixel 210 may be coupled to a bitline 218, e.g., a readout column that provides image data to readout circuitry, such as the readout circuitry 106. In operation, the pixel 210 may receive control signals from control circuitry, such as the control circuitry 104, to control the operation of the various transistors of the pixel 210. The control circuitry may control the operation of the transistors in desired sequences with relative timing that assures an ordered read out of the image data.

The illustrated embodiment of the pixel 210 includes a photodiode (PD) 211, a floating diffusion (FD1) 213 having an intrinsic capacitor (FDC) 219, a transfer transistor 212, an optional dual floating diffusion (DFD) transistor 216, an optional floating diffusion (FD2) 217 connected to an optional lateral overflow integration capacitor (LOFIC) 215, a reset (RST) transistor 214, a row select (RS) transistor 221, and a source follower (SF) transistor 220. The transfer (TX) transistor 212, which may also be referred to as a transfer gate 212, is coupled between the photodiode PD 211 and the floating diffusion FD1 213. The TX transistor 212 operates based on a TX control signal on its gate terminal. While the floating diffusion FD1 213 is depicted as connected to an intrinsic capacitor FDC 219 that is connected to ground, the combination of FD1 213 and FDC 219 may also be collectively referred to as a floating diffusion.

The RST transistor 214 may be coupled to a reference voltage AVDD and may receive a reset control signal on its gate terminal. The additional capacitance LOFIC 215 may be coupled between a variable reference voltage VCAP and floating diffusion node FD2 217. The DFD transistor 216 may be coupled between FD1 213 and FD2 217, and further coupled to receive a DFD control signal on its gate terminal. Further, a gate terminal of the SF transistor 220 is coupled to floating diffusion node FD1 213. The source/drain terminals of the SF transistor are coupled between the reference voltage AVDD and the RS transistor. The RS transistor 221 may be coupled between the bitline 218 and the SF transistor 220.

In operation, the transistor TX 212 receives gate signal to enable charge transfer from the PD 211 to the floating diffusion FD1 213. In general, the amount of charge transfer depends on the light exposure of the PD 211 and operation of the pixel 210. The equivalent capacitor FDC 219 is illustrated as coupled to ground.

In some embodiments, LOFIC 215 may increase the storage, e.g., capacitance, of the floating diffusion FD2 217. For example, in response to high intensity illumination, the photodiode PD 211 may generate more charge than the floating diffusion FD1 213 can store. The extra charge may be stored by the LOFIC 215. In some embodiments, a reference voltage VCAP may modulate between two or more voltage levels (e.g., high voltage level "H" and low voltage level "L"), thus regulating how much charge is stored by the LOFIC 215. In general, the FDC 219 has a smaller capacitance than the LOFIC 215. Therefore, the floating diffusion FD1 213 is read in conjunction with the high conversion gain (HCG) part of the data readout, while the floating diffusion FD2 217 and floating diffusion 213 are read out in conjunction with the low conversion gain (LCG) part of the readout. Collectively, HCG and LCG readouts constitute a dual conversion gain (DCG) data readout.

In some embodiments, operation of the RST transistor 214 and the DFD transistor 216 may reset the floating diffusion FD1 213 to a high voltage that represents a dark state, because photogenerated electrons, when transferred to the floating diffusion FD1 213, decrease the voltage proportionally to the intensity of the PD 211 charge. To reset the floating diffusion FD1 213, both the RST transistor 214 and the DFD transistor 216 are enabled (ON) by their respective gate signals. In other embodiments, the RST transistor 214 may be in an ON state, while the DFD transistor remains in an OFF state, hence resetting the floating diffusion FD2 217, but not resetting the floating diffusion FD1 213.

The variable voltage VCAP coupled to the LOFIC 215 may be modulated between two or more voltage levels during an integration. In some embodiments, VCAP may be modulated between around 0.4V to around 1.8V, depending on the value of AVDD. In other embodiments, other voltage levels may be implemented depending on the underlying semiconductor materials. The coupling of the FD2 217 to the FD1 213 when the DFD 216 is enabled may provide additional capacitance to store the charge generated by the PD 211. For example, when the TX 212 is enabled to transfer image charge to the floating diffusion FD1 213, the DFD 216 may be enabled to couple the additional capacitance LOFIC 215 to the floating diffusion FD1 213 to increase the full well capacity (FWC) of the floating diffusion. In some embodiments, the variable voltage VCAP may be at different voltages depending on whether the TX transistor 212 is enabled or disabled.

Figure 3:
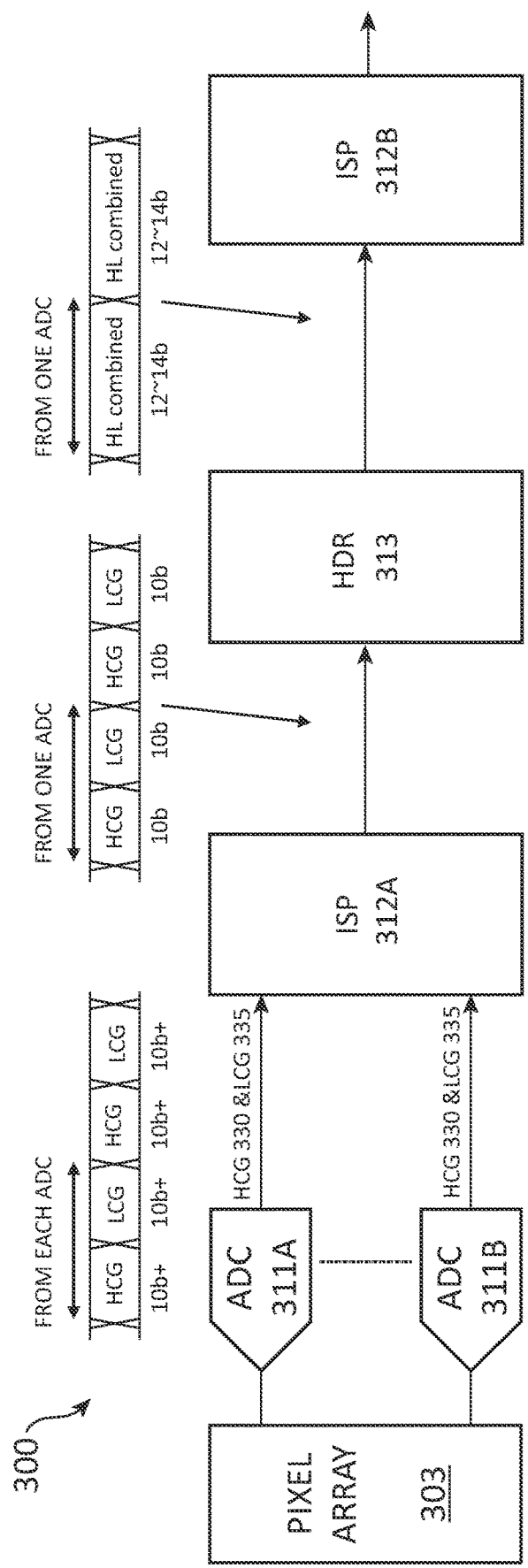
FIG. 3 is an illustrative schematic of a conventional pixel circuit for producing combined converted values of pixels, in accordance with the present disclosure.

FIG. 3 is an illustrative schematic of a conventional pixel circuit 300 for producing combined converted values of pixels, in accordance with the present disclosure. In some embodiments, the pixel array 303 is coupled to two or more analog-to-digital converters (ADCs) 311A, 311B, an image signal processor (ISP) 312 and a high dynamic range (HDR) 313. The two or more ADCs 311A, 311B are configured to pass both high conversion gain (HCG) data 330 and low conversion gain (LCG) data 335 simultaneously to the ISP 312. In general, the HCG data 330 are read from FD1 213 (or FDC 219), while the LCG data 335 are read from FD2 217 (or LOFIC 215).

In operation, the conventional pixel circuit 300 includes a pixel array 303 made up of pixels (such as shown in FIG. 1). The two or more ADCs 311A, 311B, during a pixel data readout, are communicatively coupled to a respective pixel of the plurality of pixels to receive image data from the respective pixel. The two or more ADCs 311A, 311B then output both HCG data 330 and LCG data 335 to the ISP 312A. Both the HCG data 330 and LCG data 335 are processed by the ISP 312A. The HCG data 330 and LCG data 335 are then sent to the HDR, which combines the HCG data 330 and LCG data 335 into high low combined (HL) conversion data, as shown in FIG. 3. The combined HL conversion data is then transmitted back to same ISP 312A or to another ISP 312B. Because the ISP 312A, 312B determines or selects which conversion gain data (HCG data 330, LCG data 335, or a mixture thereof) to combine and forward, additional processing power is utilized. In this manner, conventional pixel circuits require complex data processing which may cause long digital processing times and cause large power consumption in order to pass the HCG data 330 and LCG data 335 to the ISPA, ISPB. Illustratively, transmitting both the HCG data 330 and the LCG data 335 can each require as much as 10$b$ for each HCG data 330 and LCG data 335 transmitted from each pixel of the pixel array 303. Additional power is required to combine the transmitted HCG data 330 and LCG data 335.

Further, even more power gain, ranging from about 12-14b for each ADC of the plurality of ADCs is needed to transmit the combined HL and HC data to the ISP 312 after combination. Accordingly, large amounts of power are needed to transmit HCG data 330 and LCG data 335 to the ISP 312A, 312B and to provide the combined converted value of the pixels from the pixel array 303.

Figure 4:
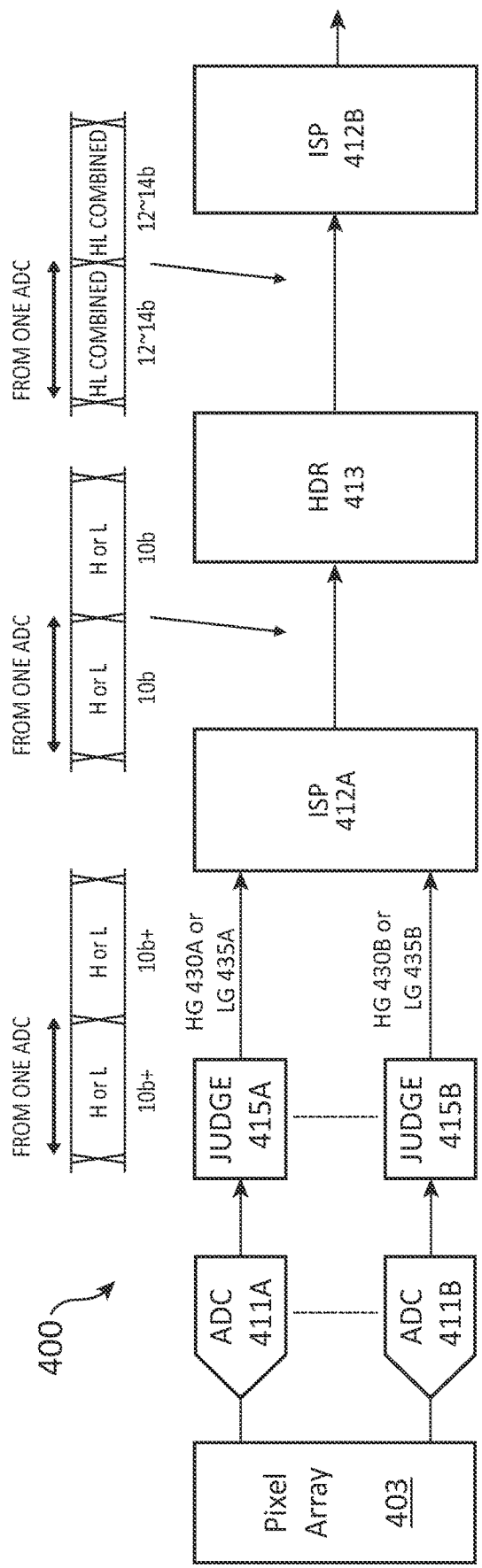
FIG. 4 is an illustrative schematic of a pixel circuit for producing combined converted values of pixels, in accordance with the present disclosure.

FIG. 4 is an illustrative schematic of a pixel circuit 400 for producing combined converted values of pixels, in accordance with the present disclosure. In some embodiments, the pixel circuit 400 includes a pixel array 403 made up of a plurality of pixels. It should be understood that in some embodiments pixel array 403 is pixel array 103 of FIG. 1. Accordingly, in some embodiments, pixel array 403 is made up of a plurality of pixels arranged in rows and columns. In some embodiments, the pixel circuit 400 further includes a plurality of analog to digital converters (ADCs) 411A, 411B, a plurality of judge blocks 415A, 415B, an image signal processor (ISP) 412, and a high dynamic range (HDR) 413. Each judge block 415A, 415B of the plurality of judge blocks 415A, 415B is communicatively coupled to a respective ADC 411A, 411B of the plurality of ADCs. In some embodiments, the plurality of ADCs is at least two ADCs 411A, 411B. In some embodiments, the plurality of judge blocks is at least two just blocks 415A, 415B.

The plurality of ADCs 411A, 411B is communicatively coupled to a respective pixel of the plurality of pixels in the pixel array 403. In operation, during a pixel readout, individual ADCs 411A, 411B receive image data from the respective pixel of the plurality of pixels in the pixel array 403. In some embodiments, each judge block 415A, 415B is configured to select and transmit gain data based on comparing an output of the respective ADC 411A, 411B to a predetermined threshold for the respective ADC 411A, 411B, as shown in FIGS. 5B and 6C. The ISP 412 receives outputs from the plurality of ADCs 411A, 411B and combines the outputs of the plurality of ADCs 411A, 411B to produce a combined converted value for the respective pixel. In some embodiments, the output of each respective ADC is a high gain (HG) code, a low gain (LG) code, or a combination thereof. The HG code may be referred to interchangeably herein as high gain (HG) data. Similarly, the LG code may be referred to interchangeably herein as low gain (LG) data.

In some embodiments, the gain data is selected from HG data 430A, 430B or a LG data 435A, 435B. In some embodiments, the gain data (HG data 430A, 430B or LG data 435A, 435B) transmitted to the ISP 412 is automatically selected based on each column of the pixel array's 403 signal level data (HG code, LG code, or a combination thereof). The plurality of judge blocks 415A, 415B may include at least one analog level detector or at least one digital level detector and may be located inside or outside of column circuitry of the pixel array 403.

In operation, the judge blocks 415A, 415B select the gain data (HG data 430A, 430B, LG data 435A, 435B, or a combination thereof) so that the ISP 412 receives only gain data from the selected gain (HG data 430A, 430B or LG data 435A, 435B, but not both HG and LG data). In this manner, the processing power may be up to 50% less than with the conventional pixel circuits, such as pixel circuit 303 in FIG. 3. Further, processing time may also be reduced up to 50% less than that of conventional pixel circuit 303. This is because only one gain data is transmitted (i.e., either the HG data 430 or the LG data 435) to the ISP 412. In some embodiments, instead of requiring 10*b* gain to transmit the high gain data 430 and 10*b* to transmit the low gain data 435, for a total of 20*b* as shown in FIG. 3, the pixel circuit 400 may only need 10*b* to transmit only the HG data 430 or the LG data 435. Further power can be saved when transmitting either the HG data 430 or the LG data 435 to the HDR. The HDR may then combine the HG data and LG data (HL combined) and pass this combined data back to the ISP 412. The judge blocks 415A, 415B may select either the HG data 430A, 430B or the LG data 435A, 435B based on a predetermined threshold, as shown and described in further detail in FIGS. 5A-8B below.

Figure 5A:
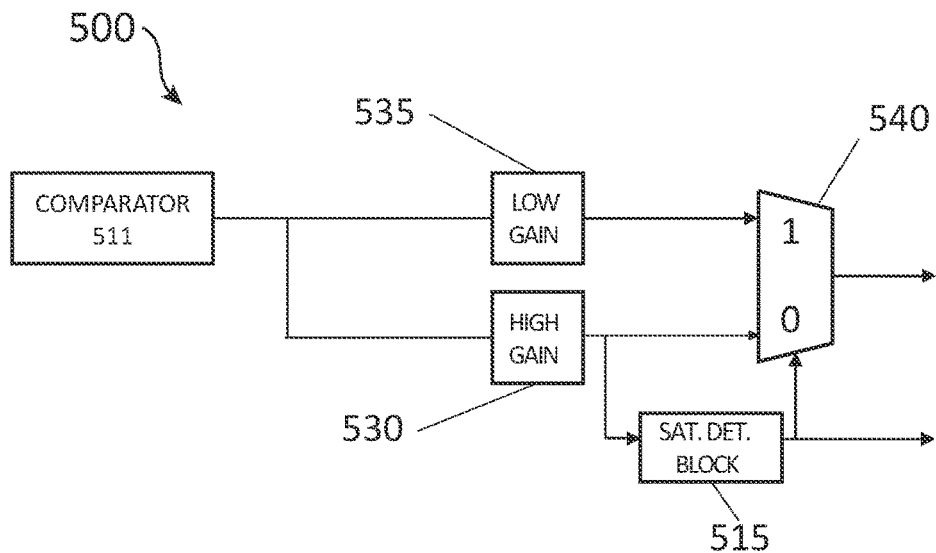
FIG. 5A is an illustrative schematic of a pixel circuit in accordance with an embodiment of the present disclosure.
Figure 5B:
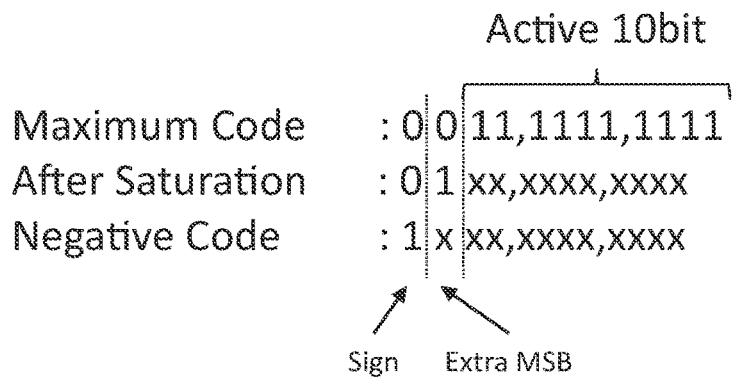
FIG. 5B is an illustrative representation of ADC code, in accordance with the present disclosure.

FIG. 5A is an illustrative schematic of a pixel circuit 500 in accordance with an embodiment of the present disclosure. In some embodiments, the pixel circuit 500 operates as a judge block 415A, 415B shown in FIG. 4. The pixel 500 includes a comparator 511, a low gain (LG) memory 535, a high gain (HG) memory 530, at least one saturation determining block 515, and at least one multiplexer (MUX) 540. In some embodiments, the comparator 511 is located within, or is otherwise integrated into an analog-to-digital converter (ADC) such as an ADC 411 of the plurality of ADCs 411A, 411B of FIG. 4.

In some embodiments, the comparator 511 is a digital comparator. In some embodiments, HG memory 530 is a memory of an ADC (such as ADC 411) and the LG memory 535 is a counter memory of the ADC. In such embodiments, the HG memory 530 and the LG memory 535 are, in combination, the ADC as described and illustrated here. It should be understood that the ADC may be, but is not limited to, a single slope ADC. In some embodiments, the ADC is a successive approximation register (SAR) ADC or the like.

In some embodiments, the at least one saturation determining block 515 is a saturation determining block of a plurality of judge blocks, such as shown in FIG. 4. In some embodiments, the predetermined threshold of the saturation determining block 515 is a saturation condition of HG code (or data). It should be understood that HG data 530 has a higher signal to noise ratio (SNR) than LG data 535 until the saturation condition of the HG data. In some embodiments, the saturation condition is set by an output (signal) of the comparator 511 is HG code at a specific level. For example, in some embodiments, the saturation condition is when the HG code is above 1023 bit value, generally depending on a bit resolution of the ADC. In some embodiments, the saturation condition is when the output of the comparator 511 is LG code at a specific level. In some embodiments, both the HG code and the LG code determine the saturation condition. In some embodiments, the HG data 530 is selected by the saturation determining block 515 and transmitted to an ISP (such as ISP 412 in FIG. 4) when the saturation condition is not met. In some embodiments, the LG data 535 is transmitted to the ISP when the saturation condition is met.

In operation, the comparator 511 outputs HG data and LG data. The HG data is stored in the HG memory 530, while the LG data is stored in the LG memory 535. In some embodiments, saturation determining block 515 compares the HG data (or code) with a predetermined threshold, such as the saturation condition of the LG data. When the HG code does not reach the predetermined threshold, the HG data is passed to the MUX 540 and transmitted to an image signal processor (ISP) such as ISP 412 in FIG. 4. This condition may be understood to correspond to a low light exposure of a particular pixel, whereby the intensity of the incoming light is low enough as not to saturate the FD1 213 (or FDC 219). When the HG code reaches or exceeds the predetermined threshold, the HG data is not transmitted, and instead, the LG data is passed to the MUX 540 and then transmitted to the ISP. This condition may be understood to correspond to a relatively light exposure of a particular pixel, whereby the intensity of the incoming light is high enough as to saturate the FD1 213 (or FDC 219) or at least high enough to exceed a certain predetermined threshold value for the HG data. Therefore, the MUX can transmit either the HG data or the LG data based on a selection by the saturation determining block 515.

FIG. 5B is an illustrative representation of example ADC code, in accordance with the present disclosure. In some embodiments, a comparator (such as comparator 511) is integrated with or coupled to an ADC (such as ADC 411A). In some embodiments, the ADC includes a sign bit and an extra bit. As shown in FIG. 5B, the inclusion of the sign bit and the extra bit (or most significant bit (MSB)) allows the ADC to determine if a saturation condition (or predetermined threshold) has been met. FIG. 5B represents an example 10 bit ADC, having 10 active bits, however, in different embodiments, ADCs with a different resolution are also possible.

When a maximum code is reached, that is a maximum HG code before reaching the saturation condition, the 10 active bits are all 1. This condition represents a threshold (a borderline case), where the sign bit is 0 and the extra bit is also 0. For light intensities up to this case, HG code is transmitted because the saturation condition has not been reached yet.

When illumination of an environment is even higher, the 10 active bits may not properly transmit, represented in FIG. 5B as "x". The sign bit is still 0, but the extra bit is set to 1. Accordingly, a signal-to-noise ratio (SNR) of the HG code has dropped significantly as the saturation condition has been met, meaning the HG code can no longer produce an acceptable image quality. This condition signifies that the LG code will be transmitted by the judge block.

Similarly, when there is no light or very low light in an environment, the ADC may transmit negative code. In such a circumstance, the sign bit is set to 1, and both the 10 active bits and the extra bit do not properly transmit, and will be blocked or disregarded by the saturation determining block 515.

Figure 5C:
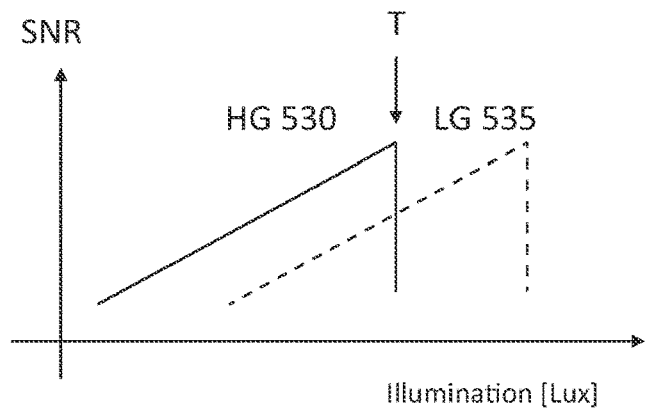
FIG. 5C is a graph of a predetermined threshold for selecting a conversion gain, in accordance with an embodiment of the present disclosure.

FIG. 5C is a graph of a predetermined threshold T for selecting a conversion gain (which may be a high gain (HG) data or a low gain (LG) data), in accordance with an embodiment of the present disclosure. On the horizontal axis is illumination in Lux. On the vertical axis is the signal-to-noise ratio (SNR). As shown in FIG. 5B, as illumination (or light level in an environment) increases, the SNR of the HG increases until a predetermined threshold T. At the predetermined threshold T, the SNR of the LG data continues to increase, even as the illumination level increases. While the LG data has higher noise overall, LG data can store more light data. Accordingly, the LG data is more suited to producing a clear image in higher light (illumination) levels than the HG data. In some embodiments, the predetermined threshold T is a saturation condition of the HG data, as shown and described in FIGS. 5A and 5B. In some embodiments, the saturation condition occurs when HG data (or code) reaches 1023 bit value for a 10-bit ADC.

In operation, the pixel circuit 500 of FIG. 5A transmits the HG data when the predetermined threshold T has not been reached. When the predetermined threshold is met, the pixel circuit transmits LG data. In some embodiments, the predetermined threshold T may be based on the LG data (or code). In some embodiments, when the LG data is above a certain threshold, the LG data is transmitted.

In some embodiments, the predetermined threshold is the saturation condition of the HG data. In operation, when the predetermined threshold is met, a respective saturation determining block 515 of the plurality of judge blocks selects the LG data, and when the predetermined threshold is not met, a respective judge block of the plurality of judge blocks selects the HG data.

Figure 6A:
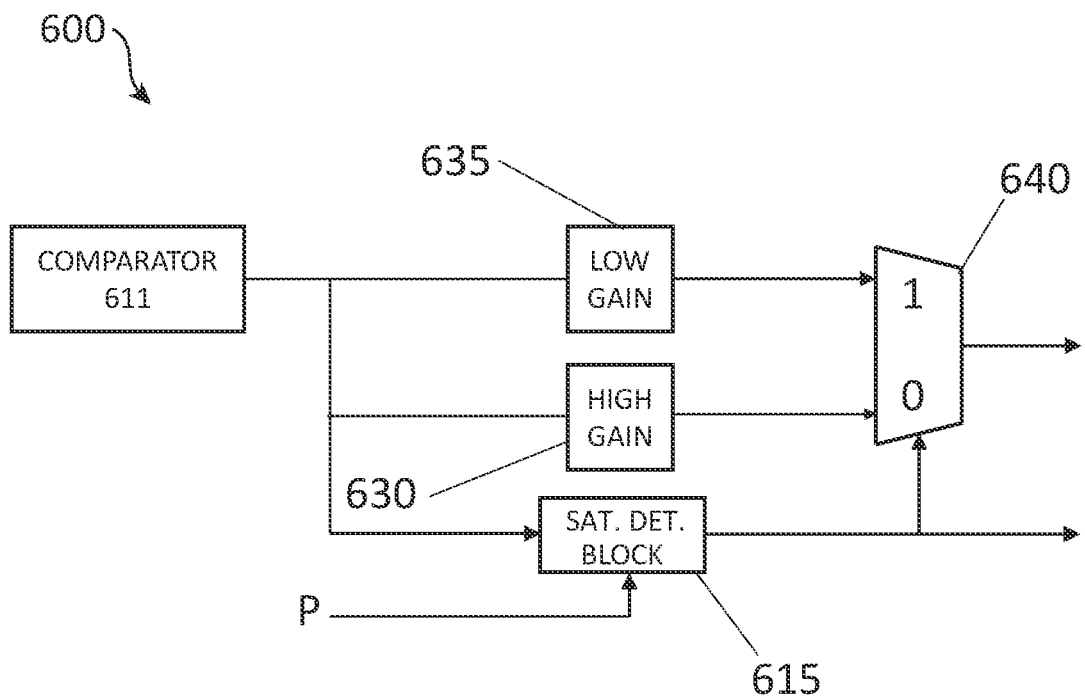
FIG. 6A is an illustrative schematic of a pixel circuit in accordance with an embodiment of the present disclosure.

FIG. 6A is an illustrative schematic of a pixel circuit 600 in accordance with an embodiment of the present disclosure. In some embodiments, the pixel circuit 600 includes a comparator 611, a high gain (HG) memory 630, and a low gain (LG) memory 635, at least one saturation determining block 615, and a multiplexer 640. In some embodiments, the comparator 611 is located within or otherwise is integrated into an analog to digital converter (ADC) such as an ADC of the plurality of ADCs 411A, 411B of FIG. 4. In some embodiments, HG memory 630 is a memory of an ADC (such as ADC 411) and the LG memory 635 is a counter memory of the ADC. In such embodiments, the HG memory 630 and the LG memory 635 are, in combination, the ADC as described and illustrated here.

Figure 6B:
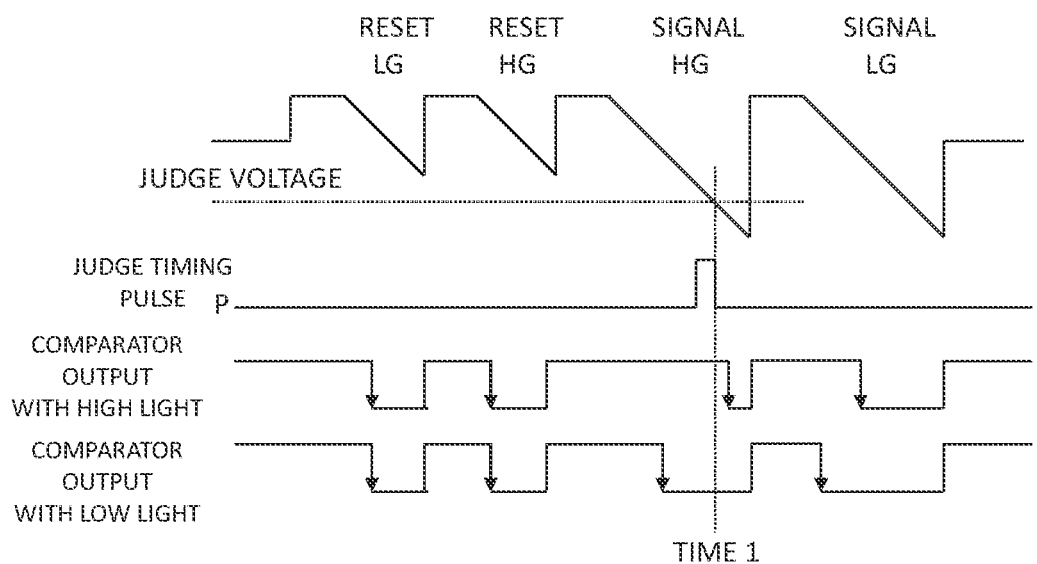
FIG. 6B is an illustrative graph of a judge timing pulse, in accordance with embodiments of the present disclosure.

In some embodiments, the at least one saturation determining block 615 is a saturation determining block of a plurality of judge blocks, as shown in FIG. 4. In some embodiments, the saturation determining block 615 selects the HG data or the LG data based on a judge timing pulse P, as shown in FIG. 6B. In operation, the judge timing pulse P triggers evaluation of the output of an ADC (such as from the comparator 611 of the ADC) of the plurality of ADCs at a predetermined time. The saturation determining block 615 may then determine is the output of the ADC (comparator 611) exceeds a predetermined threshold. If the predetermined threshold is not exceeded, HG data may be transmitted, and if the predetermined threshold is exceed, LG data may be transmitted.

In some embodiments, the comparator 611 may be an analog comparator. In operation, the comparator 611 generates a binary valued voltage that switches or flips between two binary levels when an analog input crosses a threshold voltage (e.g., 1023 for a 10 bit ADC). In some embodiments, the comparator 611 flips when transitioning between low light and high light in an environment. In some embodiments, the judge timing pulse P is issued at a predetermined time, as shown in FIG. 6B. When the judge timing pulse is issued, the output of the comparator 611 is measured. When the comparator 611 has not flipped at the predetermined time, the HG data 630 is transmitted. When the comparator 611 has flipped at the predetermined time, the LG data 635 is transmitted.

FIG. 6B is an illustrative graph of a judge timing pulse P, in accordance with embodiments of the present disclosure. On the horizontal axis is time. At the top of the graph is the voltage of a reset low gain (LG) data, a reset high gain (HG) data, an HG signal, and an LG signal. A pixel circuit (such as pixel circuit 600) is turned on after the reset voltage of the HG data and the reset voltage of the LG data ramps up. After the pixel circuit is turned on, the HG signal ramps down, and then the LG signal ramps down. On the vertical axis is the voltage of at least one judge block, the judge timing pulse P, an output of a comparator (such as comparator 611) in high light, and an output of the comparator (such as comparator 611) in low light. The vertical line near the HG signal is a predetermined time $T_1$, when the judge timing pulse is issued, and an output of the comparator (or ADC) is measured.

In some embodiments, the judge timing pulse P measures the output of the ADC (or comparator) at a predetermined time $T_1$. In operation, the judge timing pulse P determines whether the comparator is flipped at the predetermined time, as described in conjunction with FIG. 6A. As shown in FIG. 6B, under the high light condition the comparator does not flip until a ramp signal of the HG signal reaches an end point, while under the light the comparator flips much earlier during the ramp down signal of the HG signal. This is because in the low light, the HG code has not exceeded a saturation condition, whereas in the high light, the HG code has exceeded the saturation condition. In this manner, the predetermined threshold is evaluated through the comparator having flipped or not. When the comparator has not flipped, the judge block selects the LG data, and when the comparator has flipped, the judge block selects the HG data. Accordingly, when there is high light, the LG data is selected, and when there is low light, the HG data is selected. In this manner, the predetermined threshold may be based on an HG code or LG code, but whether the threshold has been met or exceeded is determined by the flip of the analog comparator.

Figure 7A:
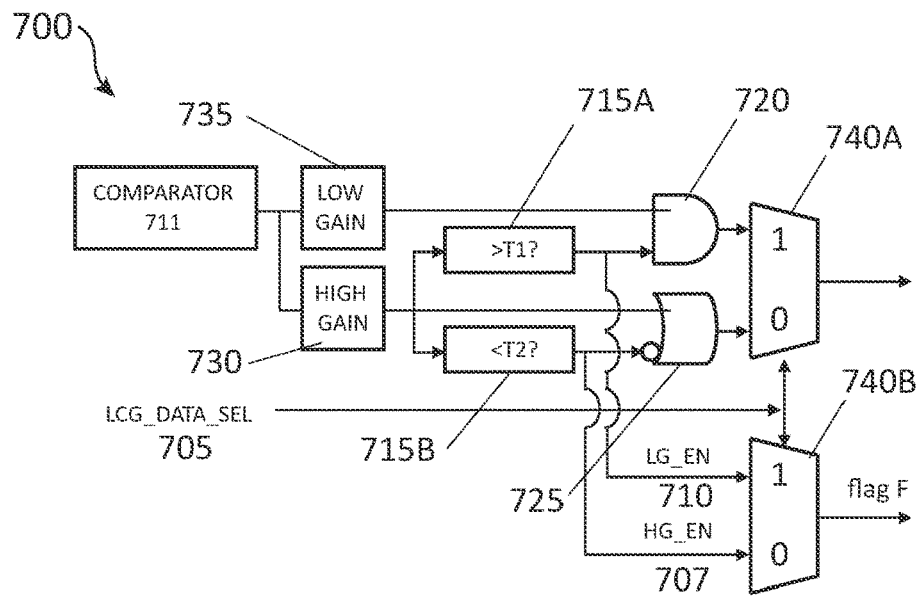
FIG. 7A is an illustrative schematic of a pixel circuit in accordance with an embodiment of the present disclosure.

FIG. 7A is an illustrative schematic of a pixel circuit 700 in accordance with an embodiment of the present disclosure. In some embodiments, an image signal processor (ISP) (such as ISP 412) mixes high gain (HG) data with low gain (LG) data around a saturation point (or predetermined threshold), for a smooth image transition. In some embodiments, the pixel circuit 700 includes a comparator 711, an HG memory 730, an LG memory 735, a plurality of saturation determining block 715A, 715B, and an AND gate 720, an NOR gate 725, a first multiplexer (MUX) 740A, and a second multiplexer (MUX) 740B. In some embodiments, the comparator 711 is located within or otherwise is integrated into an analog to digital converter (ADC) such as an ADC of the plurality of ADCs 411A, 411B of FIG. 4. In some embodiments, the comparator 711 is an analog comparator or a digital comparator. In some embodiments, the predetermined threshold includes a first threshold T1 and a second threshold T2. In some embodiments, the plurality of saturation determining block 715A, 715B, determine whether HG code (or data) has reached the first threshold T1 and/or the second threshold T2. In some embodiments, pixel circuit 700 is configured to output a flag F. In some embodiments, HG memory 730 is a memory of an ADC (such as ADC 411) and the LG memory 735 is a counter memory of the ADC. In such embodiments, the HG memory 730 and the LG memory 735 are, in combination, the ADC as described and illustrated here. It should be understood that the ADC may be, but is not limited to, a single slope ADC. In some embodiments, the ADC is a successive approximation register (SAR) ADC or the like.

In some embodiments, non-selected data (i.e., HG data or LG data) is passed to the second MUX 740A, 740B. In some embodiments, the non-selected data can be clock gated based on the flag F.

In operation, the comparator 711 transmits an output of both HG data and LG data. In some embodiments, the HG data is stored in the HG memory 730, while the LG data is stored in the LG memory 735. In some embodiments, when the gain data (both LG data and HG data) is transmitted, a first saturation determining block 715A compares the output to a first threshold T1. In some embodiments, the first threshold T1 is based on the HG code. In some embodiments, the first threshold is about 768 bit value. In some embodiments, when the first threshold is not met by the HG code, the first saturation determining block 715A disables an LG data signal (LG_EN) 710. The HG data is then transmitted to the AND block 720, which passes the HG data to the first MUX 740A, which eventually transmits the HG data to an ISP (such as ISP 412 of FIG. 4). In addition, the first judge block 715A enables an LG data signal (LG_EN) 710. This LG data signal 710 is tied the second MUX 740B, which sends out the flag F, indicating the LG data as non-selected. In this manner, LG data 735 is not transmitted to the ISP.

In some embodiments, the predetermined threshold further includes a second threshold T2. In some embodiments, when the first threshold T1 is met, the HG data is also transmitted to a second saturation determining block 715B of the plurality of saturation determining blocks 715A, 715B. In some embodiments, the second threshold is based on the HG code. In some embodiments, the second threshold is about 1023 bit value. When the first threshold T1 is met, but the second threshold T2 is not met, the HG data is still transmitted to the AND block 720, and to the first MUX 740A. When the second threshold T2 is not met, the LG data is also transmitted to the AND gate 720, combined with the HG data and transmitted to the first MUX 740A.

When the second threshold T2 is also met, e.g., when the HG code exceeds 1023 bit value, the second saturation determining block 715B selects the LG data 735 and does not select the HG data. As shown in FIG. 7A, an HG data signal (HG_EN) 707 is enabled and tied to the second MUX 740B. The second MUX 740B outputs a flag F, designating the HG as non-selected data. A person of ordinary skill would understand that the bit values discussed herein are exemplary only, e.g., different bit values may be selected for different thresholds, however, within the limits of the ADC bit resolution.

Figure 7B:
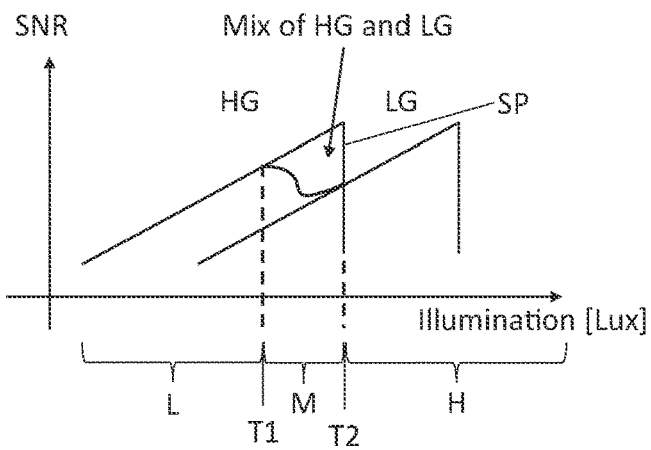
FIG. 7B is a graph of a first threshold and a second threshold for determining a selected conversion gain, in accordance with an embodiment of the present disclosure.

FIG. 7B is a graph showing a first threshold T1 and a second threshold T2 for determining a selected gain data (such as a high gain (HG) data, a low gain (LG) data, or both) in accordance with an embodiment of the present disclosure. On the horizontal axis is illumination in Lux. On the vertical axis is the signal to noise ratio (SNR). As shown in FIG. 7B, as illumination in Lux increases, the SNR of the HG data increases until a saturation point SP (which determines the saturation of the FD1 213). At the saturation point SP, the SNR of the LG continues to increase, even as the FD1 is saturated. Accordingly, the LG data (corresponding to the charge stored in the LOFIC 215) is more suited to producing a clear image under higher light (illumination) levels than is the HG data, past the saturation point SP. Also illustrated in FIG. 7B is a first threshold T1 and a second threshold T2. The first threshold T1 and the second threshold T2 demarcate three gain data transmission zones: an LG data transmission zone H, a mixed gain data transmission zone M (where both HG and LG data is transmitted), and an HG data transmission zone L.

As shown in FIG. 7B, when in the high illumination zone H, only LG data is transmitted to an ISP (such as ISP 412 in FIG. 4). When in the mid-level illumination zone M, both HG and LG data is transmitted. Finally, when in the low illumination zone L, only the HG data is transmitted. In some embodiments, the first threshold T1, the second threshold T2, or both are based on the HG code. In some embodiments, the first threshold T1, the second threshold T2, or both may be based on only LG code, or both the LG code and HG code. In some embodiments, the first threshold T1 is about an HG code of 768 bit value and the second threshold T2 is about an HG code of 1023 bit value. In some embodiments, mid-level illumination zone M is above the first threshold T1 and below the second threshold T2. In some embodiments, the mid-level illumination zone M is when the HG code is between 768 bit value and 1023 bit value. Accordingly, in some embodiments, both HG data and LG data are transmitted when the HG code is between 768 bit value and 1023 bit value.

Figure 7C:
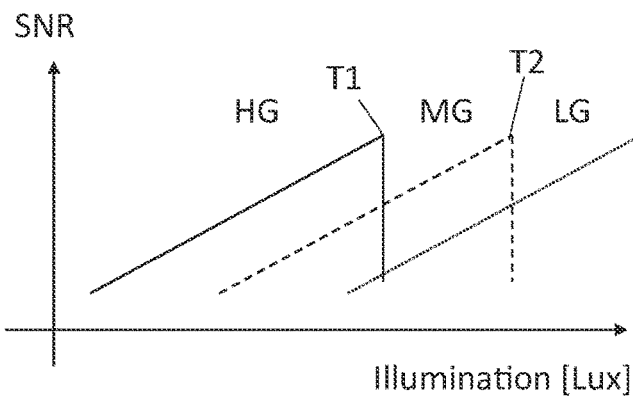
FIG. 7C is a graph of a first threshold and a second threshold for determining a selected conversion gain, in accordance with an embodiment of the present disclosure.

FIG. 7C is a graph of a first threshold and a second threshold for determining a selected conversion gain, in accordance with an embodiment of the present disclosure. On the horizontal axis is illumination in Lux. On the vertical axis is the signal-to-noise ratio (SNR). In some embodiments, the pixel circuit is configured to transmit high gain (HG) data, low gain (LG) data, and mixed conversion gain (MCG) data. In some embodiments, the pixel circuit further includes LG data transmitted from a lateral overflow integration capacitor (LOFIC) 215, as described in FIG. 1.

In some embodiments, the first threshold is a saturation condition of the HG data. In some embodiments, the second threshold is a saturation condition of the MCG data. Accordingly, in some embodiments, a saturation determining block (such as saturation determining block 715) selects either the HG, MCG, or LG data based on a light level (illumination) of an environment.

As shown in FIG. 7C, the HG data has an acceptable SNR until illumination increases to the point that the HG data reaches a saturation condition at the first threshold T1. Then, the MCG data has the next acceptable SNR.

FIG. 8A is a graph of a first threshold T1 and a second threshold T2 for determining a selected conversion gain (i.e., HG data, LG data, or both), in accordance with an embodiment of the present disclosure. On the horizontal axis is LG code, and on the vertical axis is the HG code. Also on the horizontal axis are three gain data transmission zones, an HG data transmission zone HT (marked as "HT" on horizontal axis), a mixed gain data transmission zone MT (where both HG and LG data is transmitted), and an LG data transmission zone LT (marked as "LT" on horizontal axis). In some embodiments, the mixture of HG data and LG data is dynamically adjusted based on an HG code and an LG code. The LG data transmission zone LT, mixed gain data transmission zone MT, and HG data transmission zone HT are demarcated by a second threshold T2. In some embodiments, the combination of the first threshold T1 and the second threshold T2 may be referred to as a predetermined threshold (singular) or predetermined thresholds (plural). Shown in FIG. 8A is a plurality of conversion gain coefficients. It should be understood that when a conversion gain coefficient is 1.00×, only HG data is transmitted, and when the conversion gain coefficient is 0.00×, only LG data is transmitted. Further, when conversion gain coefficient is 0.75×, 100% of both the HG data and the LG data are transmitted, and an ISP (such as ISP 312, 412) generates a combined image with 75% HG data and 25% LG data.

As shown in FIG. 8A, when in the HG data transmission zone H, only the HG data is transmitted. Similarly, when in the LG data transmission zone L, only the LG data is transmitted. The mixed conversion gain transmission zone M is when the HG code and LG code is between a first threshold T1 and a second threshold T2. As the illumination increases, the amount of HG data transmitted decreases when in the mixed conversion gain transmission zone M. When the illumination level causes the HG code to exceed the second threshold, then no HG data is transmitted.

In the mixed conversion gain transmission zone M, a combination of HG data and LG data is transmitted by an ADC (such as ADCs 411A, 411B). When the LG code increases but the HG code remains low, only HG data is transmitted (1.00×) until the HG code reaches a particular level, where some LG data is transmitted (0.75×). When the HG code increases, but the LG data remains low, only HG data is transmitted (1.00×) until the LG data reaches a high level, where some LG data is transmitted (0.75×). When both the HG code and the LG code increases, less HG data is transmitted, and more LG data is transmitted, until only LG data is transmitted (0.00×).

FIG. 8B is a graph of a predetermined threshold T for determining a selected conversion gain, in accordance with an embodiment of the present disclosure. In some embodiments, the predetermined threshold is based only on high gain (HG) code. In some embodiments, predetermined threshold T in FIG. 8A is a first threshold or a second threshold as described herein. On the vertical axis is HG code.

Shown in FIG. 8B is a plurality of conversion gain coefficients. It should be understood that when a conversion gain coefficient is 1.00×, only HG data is transmitted, and when the conversion gain coefficient is 0.00×, only LG data is transmitted. Further, when conversion gain coefficient is 0.75×, the transmitted gain data is 75% HG data and 25% LG data.

As shown in FIG. 8B, when the HG code exceeds the predetermined threshold T, HG data is not transmitted (0.00×), and LG data is transmitted. Conversely, when the HG code does not exceed the predetermined threshold T, HG data is transmitted (1.00×), while the LG data is not.

FIG. 8C is a graph of a predetermined threshold T1, T2 for determining a selected conversion gain, in accordance with an embodiment of the present disclosure. On the horizontal axis is 0. On the vertical axis is high gain (HG) code. In some embodiments, the predetermined threshold includes a first threshold T1 and a second threshold T2. In some embodiments, the first threshold T1, the second threshold T2, or both are determined only based on the HG code (or data). Shown in FIG. 8C is a plurality of conversion gain coefficients. It should be understood that when a conversion gain coefficient is 1.00×, only HG data is transmitted, and when the conversion gain coefficient is 0.00×, only LG data is transmitted. Further, when conversion gain coefficient is 0.75×, the transmitted gain data is 75% HG data and 25% LG data.

As shown in FIG. 8C, when the HG code does not exceed the first threshold T1, only HG code is transmitted (1.00×). When the HG code exceeds the first threshold T1, a mixture of HG data and low gain (LG) data is transmitted (0.75×). Between the first threshold T1 and the second threshold T2, both HG data and LG data are transmitted. As the HG code increases, less HG code is transmitted and more LG data is transmitted. Once the HG data exceeds the second threshold T2, only LG data is transmitted (0.00×).

Figure 9:
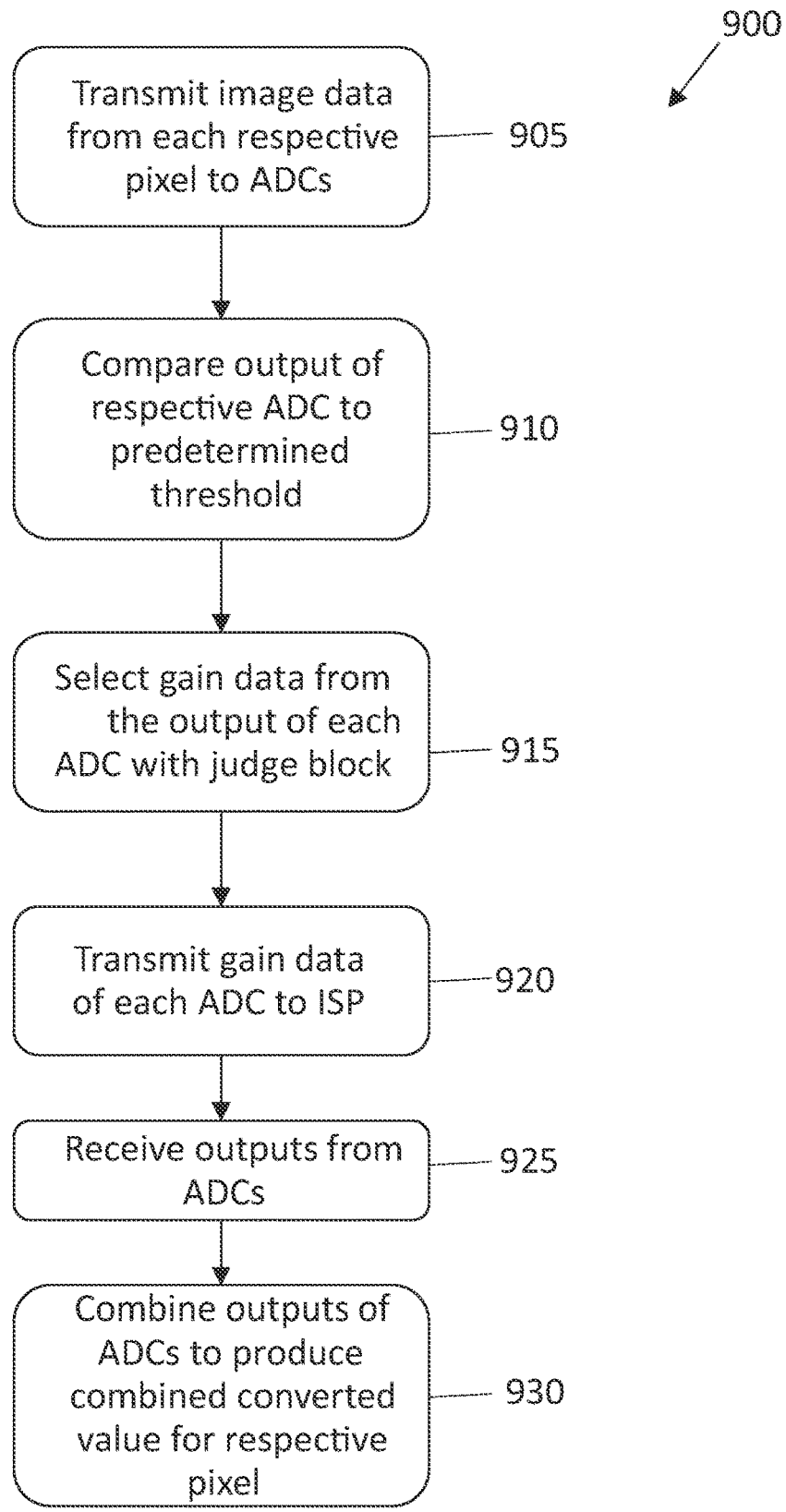
FIG. 9 is a method of producing combined converted values for pixels in a pixel circuit, in accordance with embodiments, of the present disclosure.

FIG. 9 is a method 900 of producing combined converted values for pixels in a pixel circuit, in accordance with embodiments, of the present disclosure. In some embodiments, the method 900 is carried out with the pixel circuit 400, 500, 600, 700, or a combination thereof, as described herein.

In block 905, image data from each respective pixel of a pixel array (such as pixel array 411) is transmitted to a plurality of ADCs (such as plurality of ADCs 415A, 415B). In some embodiments, the pixel array is pixel array 413 as described herein. In some embodiments, the pixel array is made up of pixels arranged in rows and columns as shown in FIG. 1. In some embodiments, the plurality of ADCs is at least two ADCs. In some embodiments, each ADC of the plurality of ADCs includes at least one comparator, such as comparator 511, 611, or 711. In some embodiments, the at least one comparator is an analog comparator, but in other embodiments, the at least one comparator is a digital comparator. In some embodiments, the pixel circuit includes a plurality of judge blocks (such as judge blocks 415). In some embodiments, the pixel circuit further includes a plurality of saturation determining blocks (such as saturation determining blocks 515, 615, and/or 715).

In block 910, an output of a respective ADC (or comparator) of the plurality of ADCs is compared to a predetermined threshold. In some embodiments, the predetermined threshold is any of the predetermined thresholds described herein. For example, in some embodiments, the predetermined threshold is a saturation condition of a high gain (HG) code such as shown in FIGS. 5A-5B. In another embodiment, the predetermined threshold is based on a judge timing pulse at a predetermined time, such as shown in FIGS. 6A-6B. In some embodiments, the predetermined threshold includes a first threshold and a second threshold, as shown in FIGS. 7A-7B. In some embodiments, the predetermined threshold is based on both the HG data and low gain (LG) data.

In block 915, a gain data of each ADC is selected by a respective judge block of the plurality of judge blocks based on whether or not the predetermined threshold is met by the output of the ADC. In some embodiments, the conversion gain is selected from the high gain (HG) data or the low gain (LG) data. In some embodiments, the gain data is selected from a mixture or combination of the HG data and the LG data, as shown and described in FIGS. 7A-7C, 8A, and 8C. In some embodiments, the judge block of the plurality of judge blocks is configured to issue a judge timing pulse at a predetermined time, and then compare the output of the respective ADC of the plurality of ADCs to the predetermined threshold.

In block 920, the selected gain data is transmitted from each ADC of the plurality of ADCs to an image signal processor (ISP) (such as ISP 412). In some embodiments, the pixel circuit conserves processing power and/or time by only transmitting the HG data or the LG data to the ISP.

In block 925, the ISP receives the output of each ADC of the plurality of ADCs. In block, 930 the plurality of outputs of each ADC of the plurality of ADCs are combined (such as by a high dynamic range (HDR)) to produce a combined converted value for each respective pixel of the pixel array.

Figure 10:
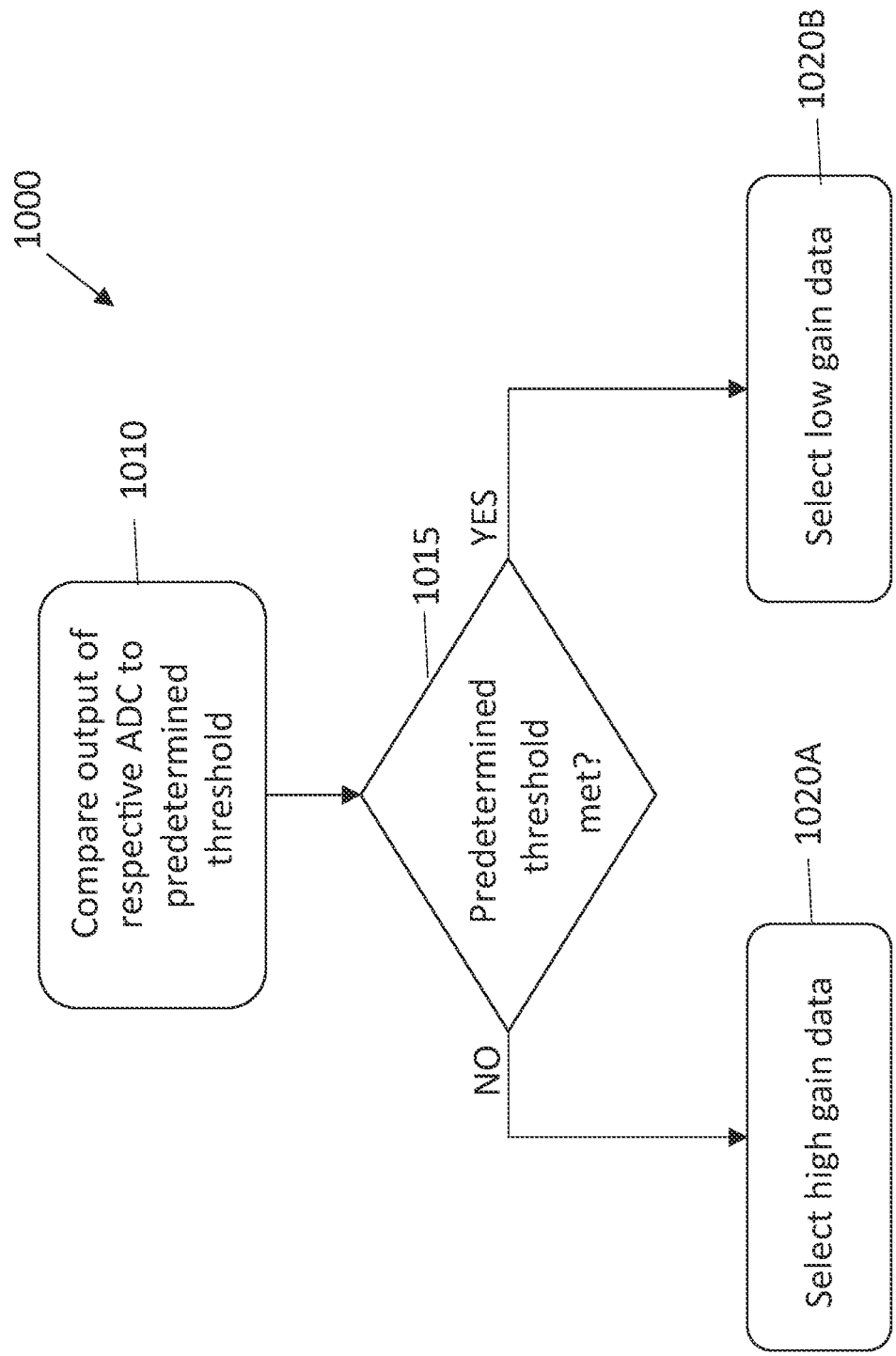
FIG. 10 is another method of producing combined converted values for pixels in a pixel circuit, in accordance with embodiments, of the present disclosure.

FIG. 10 is another method 1000 of producing combined converted values for pixels in a pixel circuit, in accordance with embodiments, of the present disclosure. In some embodiments, the method 1000 is carried out with the pixel circuit 400, 500, 600, or 700. In some embodiments, the method 1000 occurs concurrently or after the method 900.

In block 1010, an output of a respective ADC of a plurality of ADCs (such as plurality of ADCs 511A, 511B) is compared to a predetermined threshold. In some embodiments, the comparison occurs at a predetermined time, such as when a judge timing pulse is issued, as described herein. In some embodiments, the predetermined threshold is a saturation condition of high gain (HG) code (or data).

In decision block 1015, it is determined whether a predetermined threshold (such as predetermined threshold T) is met. As described herein, in some embodiments, the predetermined threshold is the HG code. In some embodiments, the predetermined threshold is based on low gain (LG) data, or both HG and LG data. In some embodiments, the predetermined threshold is when the HG code is at or above 1020 kHz. In some embodiments, the predetermined threshold is based on whether an analog comparator has flipped or not. If the predetermined threshold is not met, the method 1000 proceeds to block 1020A.

In block 1020A, the HG data is selected by the judge block. The ADC may then transmit the HG data to an ISP, as shown in FIG. 4.

Returning to block 1015, if the predetermined threshold is met, the method 1000 proceeds to block 1020B.

In block 1020B, the LG data is selected by the judge block. The ADC may then transmit the LG data to an ISP, as shown in FIG. 4.

Figure 11:
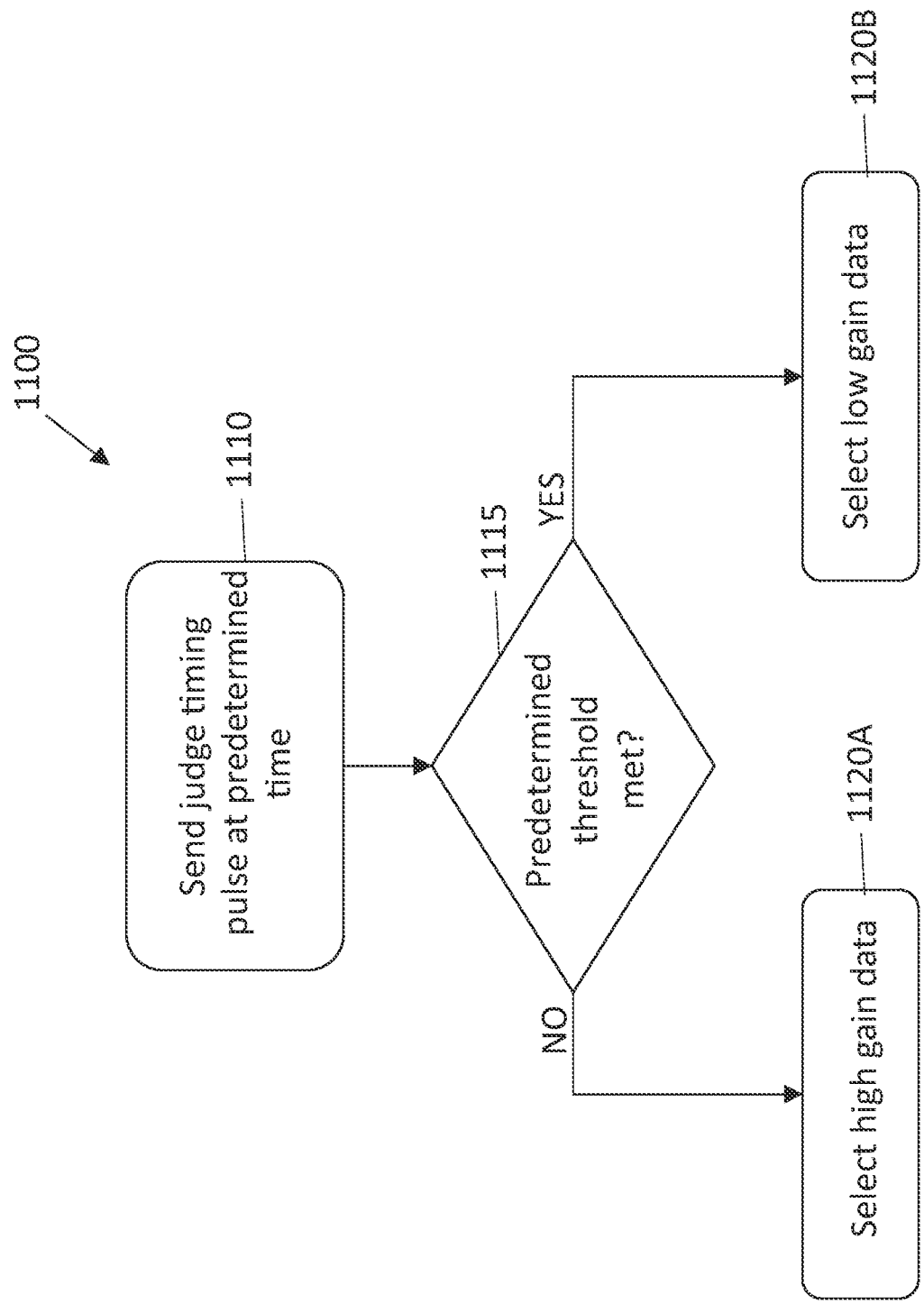
FIG. 11 is another method of producing combined converted values for pixels in a pixel circuit, in accordance with embodiments, of the present disclosure.

FIG. 11 is another method 1100 of producing combined converted values for pixels in a pixel circuit, in accordance with embodiments, of the present disclosure. In some embodiments, the method 1100 is carried out with the pixel circuit of FIG. 6A. In some embodiments, the method 1100 occurs concurrently or after the method 900.

In block 1110, a judge timing pulse is sent at a predetermined time by at least one judge block of a plurality of judge blocks. In some embodiments, this is accomplished by one or more saturation determining blocks (such as plurality of saturation determining blocks 615A, 615B). In some embodiments, the predetermined time is during a high gain (HG) signal voltage ramp. In operation, the judge timing pulse determines if a comparator (such as comparator 511 or 611) is flipped at the predetermined time. As shown in FIG. 6B, the comparator in high light does not flip until the signal voltage ramp of the HG signal reaches an end point, while the comparator receiving low light flips much earlier in the ramp signal of the HG signal. In this manner, the predetermined threshold is whether the comparator is flipped or not. When the comparator has not flipped, the judge block selects the LG data, and when the comparator has flipped, the judge block selects the HG data. Accordingly, when there is high light, the LG data is selected, and when there is low light, the HG data is selected, based on the judge timing pulse at the HG signal voltage ramp.

In decision block 1115, it is determined whether the predetermined threshold is met. As described herein, in some embodiments, the predetermined threshold is a saturation condition of high gain (HG) code. In some embodiments, the predetermined threshold is based on low gain data (LG) code, or a combination of the LG and HG code. If the predetermined threshold is not met, the method 1100 proceeds to block 1020A.

In block 1120A, the HG data is selected by the judge block.

Returning to block 1115, if the predetermined threshold is met, the method 1000 proceeds to block 1020B.

In block 1120B, the LG data is selected by the judge block.

Figure 12:
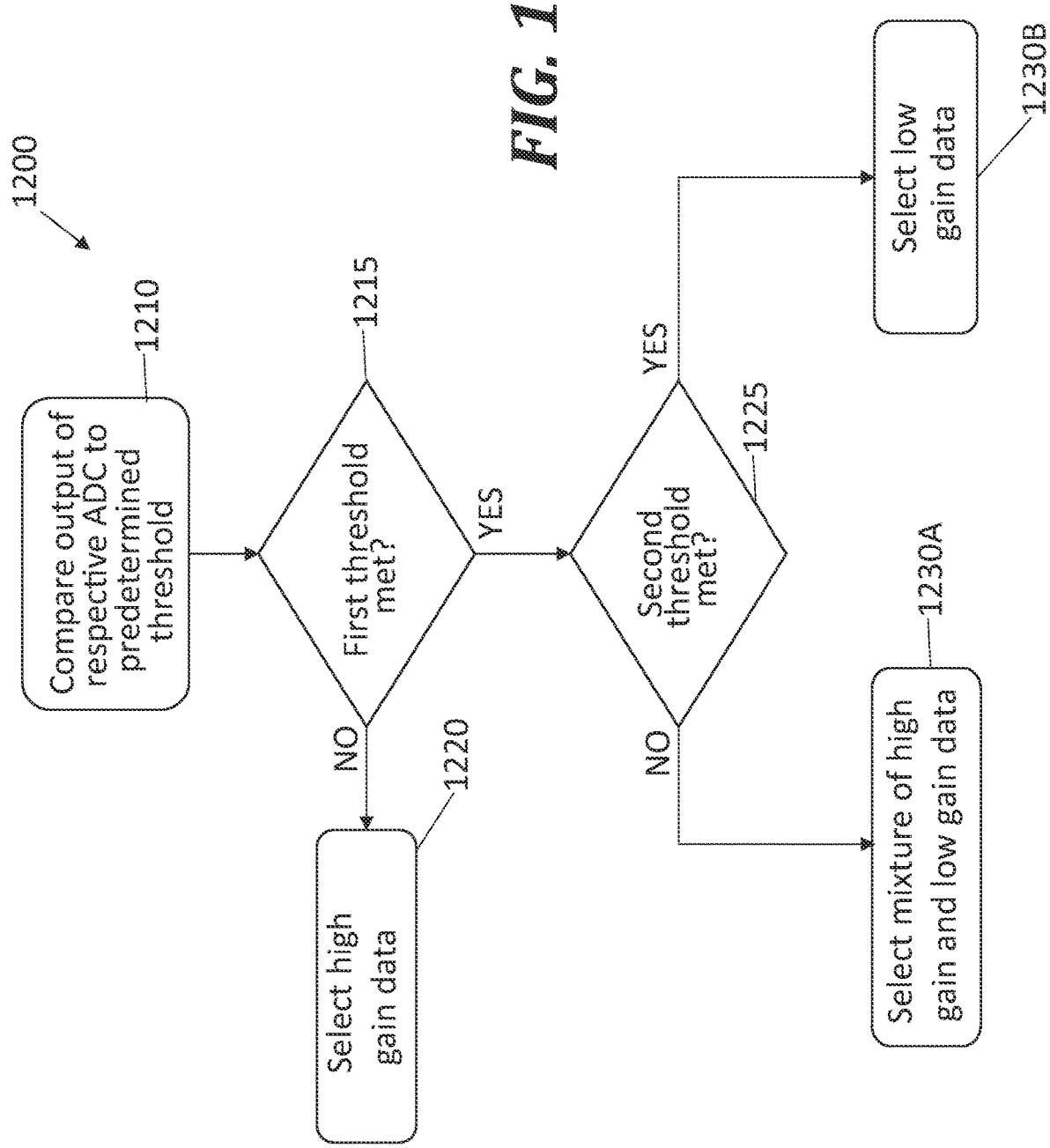
FIG. 12 is yet another method of producing combined converted values for pixels in a pixel circuit, in accordance with embodiments, of the present disclosure.

FIG. 12 is yet another method 1200 of producing combined converted values for pixels in a pixel circuit, in accordance with embodiments, of the present disclosure. In some embodiments, the method 1200 is carried out with the pixel circuit 700. In some embodiments, the method 1200 occurs concurrently or after the method 900.

In block 1210, an output of respective ADC of a plurality of ADCs (such as plurality of ADCs 511A, 511B) is compared to a predetermined threshold. In some embodiments, the predetermined threshold includes a first threshold and a second threshold. In some embodiments, both the first threshold and the second threshold are based on a high gain (HG) code. In some embodiments, the first threshold, the second threshold, or both are based on a low gain (LG) code or both HG code and LG code, such as shown in FIG. 8C.

In decision block 1215, it is determined whether the first threshold is met. As described herein, in some embodiments, the first threshold is based on a high gain (HG) code. In some embodiments, the first threshold is about 768 kHz. If the first threshold is not met, the method 1200 proceeds to block 1220.

In block 1220A, the high gain (HG) data is selected by the judge block. In some embodiments, when the HG code is below about 768 kHz, the HG data is transmitted to an ISP, such as ISP 411.

Returning to block 1115, if the predetermined threshold is met, the method 1000 proceeds to block 1225.

In decision block 1225, it is determined whether a second threshold is met. As described herein, in some embodiments, is also based on the HG code. In some embodiments, the second threshold is about 1023 kHz. If the second threshold is not met, the method 1200 proceeds to block 1230A.

Optionally, in block 1230A, a combination of the high gain (HG) data and the low gain (LG) data is selected by the judge block. In some embodiments, the mixture or combination of HG data and LG data is transmitted when the HG code is between about 768 kHz and 1023 kHz.

Returning to block 1225, if the second threshold is met, the method 1200 proceeds to block 1230B.

In block 1230B, the low gain (LG) data is selected by the judge block. In some embodiments, when the HG data is above about 1023 kHz, the LG data is transmitted.

It should be understood that all methods 900, 1000, 1100, and 1200 should be interpreted as merely representative. In some embodiments, process blocks of all methods 900, 1000, 1100, and 1200 may be performed simultaneously, sequentially, in a different order, or even omitted, without departing from the scope of this disclosure.

What is claimed is:

1. A pixel circuit, comprising:
   a pixel array comprising a plurality of pixels;
   a plurality of analog to digital converters (ADCs), wherein during a pixel data readout the plurality of ADCs is communicatively coupled to a respective plurality of pixels to receive image data from the respective pixel of the plurality of pixels;
   a plurality of judge blocks, wherein each judge block is communicatively coupled to a respective ADC of the plurality of ADCs and wherein each judge block is configured to select and transmit gain data based on comparing an output of the respective ADC to a predetermined threshold for the respective ADC; and
   an image signal processor (ISP) configured to:
   receive outputs from the plurality of ADCs; and
   combine the outputs of the plurality of ADCs to produce a combined converted value for the respective pixel.

2. The pixel circuit of claim 1, wherein the gain data is selected from a high gain (HG) data, a low gain (LG) data, or a combination thereof.

3. The pixel circuit of claim 2, wherein the predetermined threshold is based on the HG data.

4. The pixel circuit of claim 2, wherein:
   when the predetermined threshold is met or exceeded, a respective judge block of the plurality of judge blocks selects the LG data; and
   when the predetermined threshold is not met, a respective judge block of the plurality of judge blocks selects the HG data.

5. The pixel circuit of claim 1, wherein the plurality of ADCs comprises at least two ADCs, and the plurality of judge blocks comprises at least two judge blocks.

6. The pixel circuit of claim 1, wherein the predetermined threshold is based on at least one judge timing pulse of the plurality of judge blocks, wherein the judge timing pulse provides a trigger signal for determining whether a comparator of each ADC of the plurality of ADCs is flipped at a predetermined time.

7. The pixel circuit of claim 2, wherein:
   the predetermined threshold comprises a first threshold; and
   wherein, when the HG data is below the first threshold, the HG data is selected.

8. The pixel circuit of claim 7, wherein:
   the predetermined threshold further comprises a second threshold; and
   wherein, when the HG data is above the second threshold, the LG data is selected.

9. The pixel circuit of claim 8, wherein when the HG data is between the first threshold and the second threshold, a mixture of both the HG data and the LG data are selected.

10. The pixel circuit of claim 9, wherein the mixture of the HG data and the LG data is a ratio of the HG data and the LG data based on the HG data.

11. The pixel circuit of claim 10, wherein the mixture of the HG data and the LG data is a ratio of the HG data and the LG data based on the HG data and the LG data.

12. The pixel circuit of claim 10, wherein the first threshold is about 768 bit value and the second threshold is about 1023 bit value.

13. A method of producing a combined converted value of the pixel circuit of claim 1, the method comprising:
   transmitting the image data from each respective pixel of the plurality of pixels to the plurality of ADCs;
   comparing an output of the respective ADC to the predetermined threshold for the respective ADC;
   selecting the gain data from the output of each ADC with each judge block of the plurality of judge blocks;
   transmitting the gain data of each ADC of the plurality of ADCs to the ISP;
   receiving outputs from the plurality of ADCs with the ISP; and
   combining the outputs of the plurality of ADCs to produce a combined converted value for the respective pixel.

14. A method of producing a combined converted value of a pixel circuit comprising, a pixel array comprising a plurality of pixels; a plurality of analog to digital converters (ADCs), wherein during a pixel data readout, the plurality of ADCs is communicatively coupled to a respective plurality of pixels to receive image data from the respective pixel of the plurality of pixels; and a plurality of judge blocks, wherein each judge block is communicatively coupled to a respective ADC of the plurality of ADCs and wherein each judge block is configured to select and transmit gain data based on comparing an output of the respective ADC to a predetermined threshold for the respective ADC, the method comprising:
   transmitting the image data from each respective pixel of the plurality of pixels to the plurality of ADCs;
   comparing an output of the respective ADC to the predetermined threshold for the respective ADC;
   selecting the gain data from the output of each ADC with each judge block of the plurality of judge blocks;
   transmitting the gain data of each ADC of the plurality of ADCs to the ISP;
   receiving outputs from the plurality of ADCs with the ISP; and
   combining the outputs of the plurality of ADCs to produce a combined converted value for the respective pixel.

15. The method of claim 14, wherein the gain data is selected from a high gain (HG) data, a low gain (LG) data, or a combination thereof.

16. The method of claim 15, wherein the method further comprises:
   when the predetermined threshold is met, selecting the LG data with a respective judge block of the plurality of judge blocks; and
   when the predetermined threshold is not met, selecting the HG data with the respective judge block of the plurality of judge blocks.

17. The method of claim 15, wherein the predetermined threshold comprises a saturation condition of the HG data.

18. The method of claim 15, wherein the method further comprises:
   issuing a judge timing pulse at a predetermined time with at least one judge block of a plurality of judgment blocks;
   measuring the output of each ADC of the plurality of ADCs at the predetermined time;
   when a comparator of the ADC is not flipped, selecting the HG data; and
   when the comparator of the ADC is flipped, selecting the LG data.

19. The method of claim 15, wherein the predetermined threshold comprises a first threshold and a second threshold, and wherein the method further comprises:
   when the HG data is below the first threshold, selecting the HG data; and
   when the HG data is above the second threshold, selecting the LG data.

20. The method of claim 19, wherein the method further comprises, when the HG data is between the first threshold and the second threshold, selecting and transmitting a mixture of both the HG data and the LG data.

* * * * *